(12) United States Patent
Chang et al.

(10) Patent No.: US 9,899,237 B2
(45) Date of Patent: Feb. 20, 2018

(54) CARRIER, SEMICONDUCTOR PACKAGE AND FABRICATION METHOD THEREOF

(71) Applicant: Siliconware Precision Industries Co., Ltd, Taichung (TW)

(72) Inventors: Chiang-Cheng Chang, Taichung (TW); Meng-Tsung Lee, Taichung (TW); Jung-Pang Huang, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 36 days.

(21) Appl. No.: 14/174,988

(22) Filed: Feb. 7, 2014

(65) Prior Publication Data
US 2014/0154842 A1 Jun. 5, 2014

Related U.S. Application Data

(62) Division of application No. 13/440,180, filed on Apr. 5, 2012, now Pat. No. 8,680,692.

(30) Foreign Application Priority Data

Jan. 20, 2012 (TW) .............................. 101102490 A

(51) Int. Cl.
*H01L 23/00* (2006.01)
*H01L 23/31* (2006.01)
(Continued)

(52) U.S. Cl.
CPC ............ *H01L 21/56* (2013.01); *H01L 21/561* (2013.01); *H01L 21/568* (2013.01); *H01L 21/673* (2013.01); *H01L 21/76877* (2013.01); *H01L 21/78* (2013.01); *H01L 23/3114* (2013.01); *H01L 24/19* (2013.01); *H01L 24/96* (2013.01);
(Continued)

(58) Field of Classification Search
CPC . H01L 2224/96; H01L 2224/97; H01L 24/96; H01L 23/31; H01L 23/3107; H01L 23/3114; H01L 23/3121; H01L 21/56; H01L 21/566; H01L 21/4832; H01L 21/673; H01L 21/67333; H01L 21/67763; H01L 21/68; H01L 21/683; H01L 21/301
See application file for complete search history.

(56) References Cited

U.S. PATENT DOCUMENTS 4,246,595 A * 1/1981 Noyori ................ G02F 1/13452
257/668
4,544,989 A 10/1985 Nakabu et al.
(Continued)

*Primary Examiner* — David Zarneke
(74) *Attorney, Agent, or Firm* — Mintz Levin Cohn Ferris Glovsky and Popeo, P.C.; Peter F. Corless; Steven M. Jensen

(57) ABSTRACT

A fabrication method of a semiconductor package includes the steps of: providing a carrier having a concave portion and a releasing layer formed on a surface thereof; disposing a chip on the releasing layer in the concave portion; forming an encapsulant on the chip and the releasing layer; removing the releasing layer and the carrier; and forming a circuit structure on the encapsulant and the chip. The design of the concave portion facilitates alignment of the chip to prevent it from displacement, thereby improving the product reliability. A semiconductor package fabricated by the fabrication method is also provided.

9 Claims, 4 Drawing Sheets

(51) Int. Cl.
  *H01L 21/56* (2006.01)
  *H01L 21/673* (2006.01)
  *H01L 21/768* (2006.01)
  *H01L 21/78* (2006.01)
  H01L 21/68 (2006.01)
  H01L 21/48 (2006.01)
  H01L 21/683 (2006.01)
  H01L 21/677 (2006.01)

(52) U.S. Cl.
  CPC ........ *H01L 21/4832* (2013.01); *H01L 21/566* (2013.01); *H01L 21/67333* (2013.01); *H01L 21/67763* (2013.01); *H01L 21/68* (2013.01); *H01L 21/683* (2013.01); *H01L 23/31* (2013.01); *H01L 23/3107* (2013.01); *H01L 23/3121* (2013.01); *H01L 24/05* (2013.01); *H01L 24/13* (2013.01); *H01L 2224/02379* (2013.01); *H01L 2224/0401* (2013.01); *H01L 2224/04105* (2013.01); *H01L 2224/05548* (2013.01); *H01L 2224/12105* (2013.01); *H01L 2224/131* (2013.01); *H01L 2224/13022* (2013.01); *H01L 2224/13024* (2013.01); *H01L 2224/96* (2013.01); *H01L 2224/97* (2013.01); *H01L 2924/1815* (2013.01)

(56) References Cited

U.S. PATENT DOCUMENTS

| | | | | |
|---|---|---|---|---|
| 5,008,213 A * | 4/1991 | Kolesar, Jr. | ............... | H01L 23/13 257/E21.505 |
| 5,089,314 A * | 2/1992 | Masujima | ............... | B65G 35/04 206/713 |
| 5,353,498 A | 10/1994 | Fillion et al. | | |
| 5,422,513 A | 6/1995 | Marcinkiewicz et al. | | |
| 5,769,237 A * | 6/1998 | Althouse | ............ | H05K 13/0417 206/460 |
| 5,866,952 A | 2/1999 | Wojnarowski et al. | | |
| 6,154,366 A | 11/2000 | Ma et al. | | |
| 6,225,205 B1 * | 5/2001 | Kinoshita | ............... | H01L 24/11 257/E21.508 |
| 6,271,469 B1 * | 8/2001 | Ma | ..................... | H01L 21/56 174/521 |
| 6,412,641 B1 * | 7/2002 | Anderson | ............. | B65D 73/02 206/460 |
| 6,452,265 B1 | 9/2002 | Furukawa et al. | | |
| 6,507,092 B1 | 1/2003 | Fukasawa et al. | | |
| 6,515,347 B1 * | 2/2003 | Shinma et al. | ............... | 257/620 |
| 6,528,722 B2 | 3/2003 | Huang et al. | | |
| 6,709,898 B1 * | 3/2004 | Ma | ..................... | H01L 23/3128 257/675 |
| 6,825,553 B2 * | 11/2004 | Chua et al. | | |
| 6,856,017 B2 | 2/2005 | Yoneda et al. | | |
| 7,202,107 B2 | 4/2007 | Fuergut et al. | | |
| 7,299,546 B2 * | 11/2007 | Tuominen et al. | ............. | 29/840 |
| 7,312,101 B2 * | 12/2007 | Jiang | .................... | H01L 23/5389 257/E21.505 |
| 7,485,562 B2 * | 2/2009 | Chua et al. | ............. | H01L 23/48 |
| 7,897,432 B2 * | 3/2011 | Sakaguchi | ............ | H01L 21/568 257/E21.499 |
| 7,927,922 B2 * | 4/2011 | Shen | ..................... | H01L 21/568 438/114 |
| 7,977,163 B1 * | 7/2011 | Huemoeller | .......... | H01L 21/561 257/773 |
| 8,247,897 B2 * | 8/2012 | Brunnbauer et al. | ......... | 257/687 |
| 8,358,001 B2 * | 1/2013 | Yang et al. | ............. | 257/698 |
| 8,405,213 B2 * | 3/2013 | Chen et al. | ............. | H01L 23/48 |
| 8,519,526 B2 * | 8/2013 | Huang | .................. | H01L 21/568 257/668 |
| 8,530,753 B2 | 9/2013 | Kunimoto et al. | | |
| 8,796,561 B1 * | 8/2014 | Scanlan et al. | | |
| 9,093,449 B2 * | 7/2015 | Lai | ....................... | H01L 21/565 |
| 9,312,151 B2 * | 4/2016 | Sasaki | .................... | H01L 21/568 |
| 9,373,604 B2 * | 6/2016 | Yu | ....................... | H01L 23/3135 |
| 9,484,285 B2 * | 11/2016 | Chen | .................. | H01L 21/486 |
| 2003/0102572 A1 * | 6/2003 | Nathan | .................. | H05K 1/185 257/780 |
| 2004/0207077 A1 * | 10/2004 | Leal et al. | | |
| 2005/0258552 A1 * | 11/2005 | Kim | ..................... | H01L 21/561 257/787 |
| 2006/0278972 A1 * | 12/2006 | Bauer et al. | | |
| 2007/0216004 A1 * | 9/2007 | Brunnbauer et al. | ... | H01L 23/02 |
| 2008/0138938 A1 * | 6/2008 | Wenzel | .................. | H01L 21/56 438/127 |
| 2012/0119378 A1 * | 5/2012 | Ng et al. | ..................... | 257/774 |
| 2013/0037990 A1 * | 2/2013 | Lin | ..................... | H01L 21/561 264/272.17 |
| 2014/0056126 A1 * | 2/2014 | Bencheck et al. | ...... | H04L 12/26 |
| 2015/0108667 A1 * | 4/2015 | Lai et al. | ................. | H01L 25/50 |

* cited by examiner

CARRIER, SEMICONDUCTOR PACKAGE AND FABRICATION METHOD THEREOF

CROSS-REFERENCE TO RELATED APPLICATIONS

This application is a divisional of copending application U.S. Ser. No. 13/440,180, filed on Apr. 5, 2012, which claims under 35 U.S.C. § 119(a) the benefit of Taiwanese Application No. 101102490, filed Jan. 20, 2012, the entire contents of which are incorporated herein by reference.

BACKGROUND OF THE INVENTION

1. Field of the Invention

The present invention relates to semiconductor packages and fabrication methods thereof, and more particularly, to a semiconductor package having an embedded chip and a fabrication method thereof.

2. Description of Related Art

Along with the rapid development of electronic industries, electronic products are developed towards multi-function and high performance. To meet the miniaturization requirement of semiconductor packages, wafer level packaging (WLP) technologies have been developed.

U.S. Pat. No. 6,452,265 and U.S. Pat. No. 7,202,107 provide fabrication methods of wafer-level packages. FIGS. 1A to 1E are cross-sectional views showing a fabrication method of a semiconductor package 1 according to the prior art.

Referring to FIG. 1A, a thermal adhesive layer 11 is formed on a carrier 10.

Referring to FIG. 1B, a plurality of chips 12 are disposed on the thermal adhesive layer 11. Each of the chips 12 has an active surface 12a with a plurality of electrode pads 120 and an inactive surface 12b opposite to the active surface 12a, and the chips 12 are disposed on the thermal adhesive layer 11 via the active surfaces 12a thereof.

Referring to FIG. 1C, an encapsulant 13 is formed on the chips 12 and the thermal adhesive layer 11.

Referring to FIG. 1D, the thermal adhesive layer 11 and the carrier 10 are removed to expose the active surfaces 12a of the chips 12.

Referring to FIG. 1E, a circuit structure 14 is formed on the encapsulant 13 and the active surfaces 12a of the chips 12 and electrically connected to the electrode pads 120 of the chips 12.

However, when the chips 12 are disposed on the plate-shaped carrier 10 having the thermal adhesive layer 11, it is difficult to align the chips 12 on the carrier, thus easily causing displacement of the chips 12 and reducing the product reliability.

In addition, since the thermal adhesive layer 11 is adhesive, it may expand or contract due to its coefficient of thermal expansion (CTE) during the fabrication process, such that displacement of the chips 12 tends to occur. For example, during formation of the encapsulant 13, the thermal adhesive layer 11 is softened by heat to cause displacement of the chips 12. Consequently, the circuit structure 14 to be formed later cannot be precisely connected to the electrode pads 120 of the chips 12, thereby resulting in poor electrical performance and product reliability.

Therefore, how to overcome the above-described drawbacks has become critical.

SUMMARY OF THE INVENTION

In view of the above-described drawbacks, the present invention provides a semiconductor package, which comprises: an encapsulant having a protruding portion; a chip embedded in the protruding portion of the encapsulant, wherein the chip has an active surface with a plurality of electrode pads and an inactive surface opposite to the active surface, the active surface and the electrode pads being exposed from the protruding portion of the encapsulant; and a circuit structure formed on the encapsulant and the active surface of the chip and electrically connected to the electrode pads of the chip.

The present invention further provides a fabrication method of a semiconductor package, which comprises the steps of: providing a carrier having a concave portion and a releasing layer formed on a surface thereof; disposing a chip on the releasing layer in the concave portion, wherein the chip has an active surface with a plurality of electrode pads and an inactive surface opposite to the active surface, the chip being disposed on the releasing layer via the active surface thereof; forming an encapsulant on the chip and the releasing layer; removing the releasing layer and the carrier so as to expose the active surface of the chip; and forming a circuit structure on the encapsulant and the active surface of the chip, wherein the circuit structure is electrically connected to the electrode pads of the chip.

The present invention further provides a carrier for fabricating a semiconductor package, wherein the carrier has a concave portion and a releasing layer formed on a surface thereof.

In an embodiment, the carrier can be made of glass or metal, and the releasing layer can be made of a hydrophobic material, an inorganic material or a polymer material.

In an embodiment, a plurality of concave portions are provided and array arranged on the carrier such that the above-described method further comprises performing a singulation process after forming the circuit structure on the encapsulant and the active surface of the chip.

In an embodiment, the carrier is removed first and then the releasing layer is removed. Alternatively, the carrier and the releasing layer can be removed simultaneously.

In an embodiment, the circuit structure has at least a dielectric layer formed on the encapsulant and the active surface of the chip, a circuit layer formed on the dielectric layer and a plurality of conductive vias formed in the dielectric layer for electrically connecting the circuit layer and the electrode pads of the chip. Further, an insulating protection layer can be formed on the outermost dielectric layer of the circuit structure and have a plurality of openings therein such that portions of the circuit layer are exposed through the openings so as for conductive elements to be disposed thereon.

Therefore, through the design of the concave portion on the carrier, the present invention facilitates alignment of the chip so as to prevent it from displacement that may otherwise impose difficulty in subsequent fabrication processes such as a circuit built-up process and reduce the product reliability.

Further, since the releasing layer is not adhesive, the releasing layer does not expand or contract due to its CTE during the fabrication process, thereby avoiding displacement of the chip, facilitating subsequent fabrication processes and improving the product reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'on', 'a' etc. are only used as a matter of descriptive convenience and not intended to have any other significance or provide limitations for the present invention.

FIGS. 2A to 2G are schematic cross-sectional views showing a fabrication method of a semiconductor package 2 according to the present invention.

Figure 1A:
FIGS. 1A to 1E are schematic cross-sectional views showing a fabrication method of a semiconductor package according to the prior art.
Figure 1B:
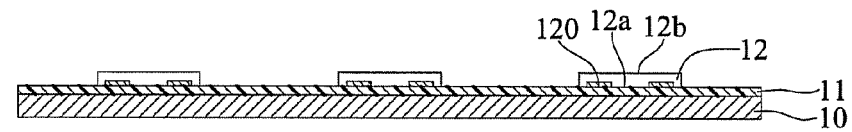
Figure 1C:
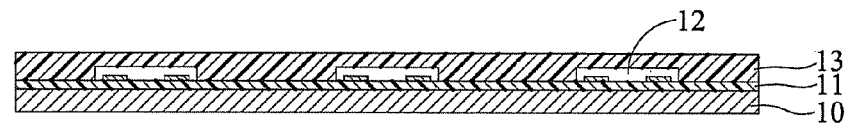
Figure 1D:
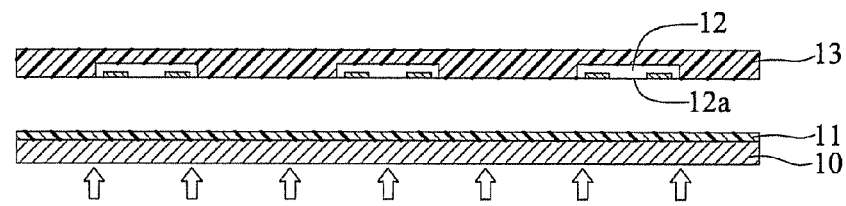
Figure 1E:
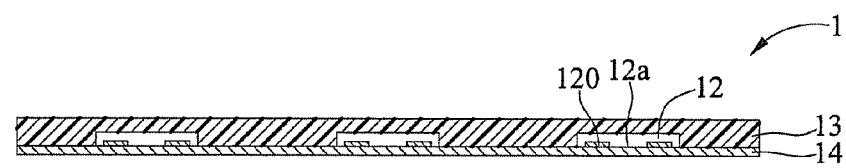
Figure 2A:
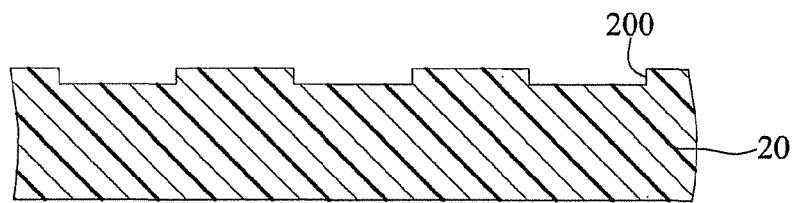
FIGS. 2A to 2G are schematic cross-sectional views showing a fabrication method of a semiconductor package according to the present invention, wherein FIG. 2A' is an upper view of FIG. 2A and FIG. 2E' shows another embodiment of FIG. 2E.
Figure 2A:
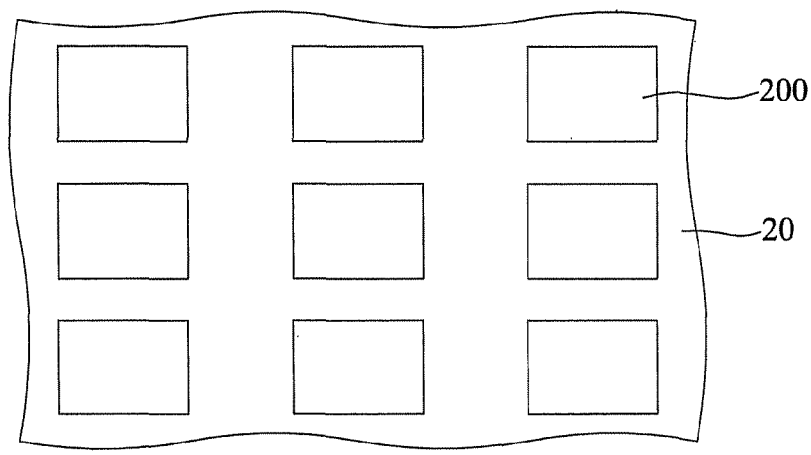

Referring to FIGS. 2A and 2A', a carrier 20 having a plurality of concave portions 200 is provided. In the present embodiment, the carrier 20 is made of glass or metal, and the concave portions 200 are array arranged on the carrier 20.

Figure 2B:
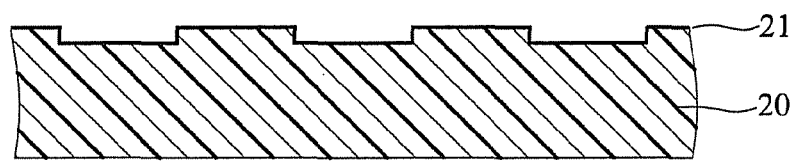

Referring to FIG. 2B, a releasing layer 21 is formed on the carrier 20 and the concave portions 200.

In the present embodiment, the releasing layer 21 is made of a hydrophobic material, an inorganic material or a polymer material such as poly-para-xylylene (parylene), and formed through plasma-enhanced chemical vapor deposition (PECVD).

The present invention replaces the conventional thermal adhesive material with the releasing layer 21 to reduce the fabrication cost.

Figure 2C:
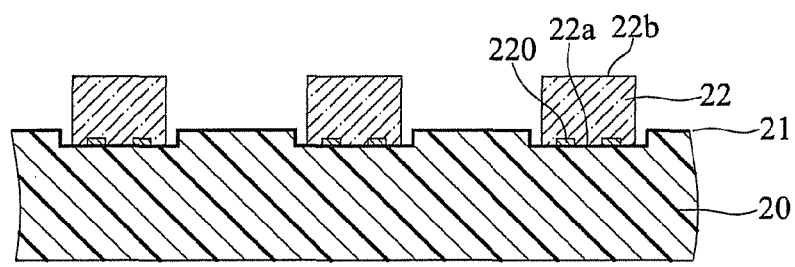

Referring to FIG. 2C, a plurality of chips 22 are disposed on the releasing layer 21 in the concave portions 200, respectively. Each of the chips 22 has an active surface 22a with a plurality of electrode pads 220 and an inactive surface 22b opposite to the active surface 22a, and the chips 22 are disposed on the releasing layer 21 via the active surfaces 22a thereof.

The concave portions 200 facilitate alignment of the chips 22 so as to avoid displacement of the chips 22.

Further, since the releasing layer 21 is not adhesive, particularly to the carrier 20 made of glass, the releasing layer 21 does not expand or extract due to its CTE during the fabrication process, thereby avoiding displacement of the chips 22. As such, a circuit structure to be formed in a subsequent circuit built-up process can be effectively and precisely electrically connected to the electrode pads 220 of the chips 22 such that the electrical performance and product reliability can be improved.

Figure 2D:
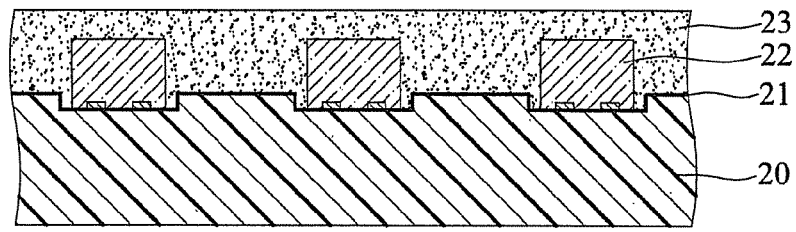

Referring to FIG. 2D, an encapsulant 23 is formed on the chips 22 and the releasing layer 21.

In the present embodiment, the encapsulant 23 is made of, but not limited to, polyimide (PI), and formed through coating. Alternatively, the encapsulant 23 can be formed through lamination or molding.

Figure 2E:
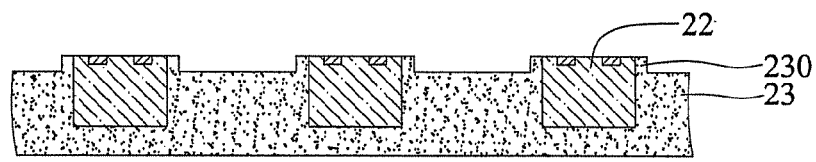
Figure 2E:
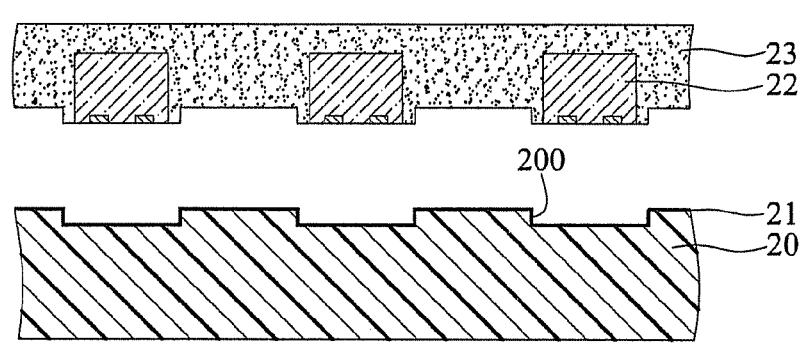

Referring to FIG. 2E, the releasing layer 21 and the carrier 20 are removed to expose the active surfaces 22a of the chips 22 and a plurality of protruding portions 230 of the encapsulant 23.

In the present embodiment, the carrier 20 is first removed from the releasing layer 21 and then the releasing layer 21 is removed from the encapsulant 23 and the chip 22.

In another embodiment, the releasing layer 21 can be removed from the encapsulant 23 and the chips 22 simultaneously with the carrier 20, as shown in FIG. 2E'.

Figure 2F:
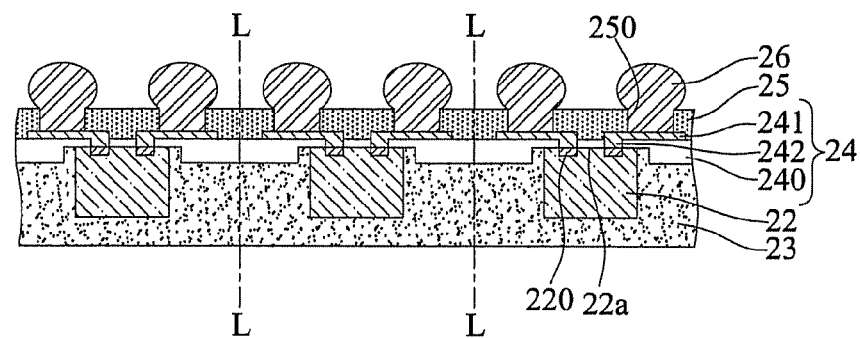

Referring to FIG. 2F, a circuit built-up process is performed to form a circuit structure 24 on the encapsulant 23 and the active surfaces 22a of the chips 22. Therein, the circuit structure 24 is electrically connected to the electrode pads 220 of the chips 22.

In the present embodiment, the circuit structure 24 has at least a dielectric layer 240, a circuit layer 241 formed on the dielectric layer 240 and a plurality of conductive vias 242 formed in the dielectric layer 230 for electrically connecting the circuit layer 241 and the electrode pads 220 of the chips 22. Therein, the number of the dielectric layers 240 can be multiple, and the number of the circuit layer 241 can be increased to meet circuit layout requirements of the semiconductor package.

Subsequently, an insulating protection layer 25 is formed on the outermost dielectric layer 240 and a plurality of openings 250 are formed in the insulating protection layer 25 such that portions of the circuit layer 241 are exposed through the openings 250 so as for conductive elements 26 to be disposed thereon. The conductive elements 26 can be, but not limited to, solder balls, solder bumps or solder pins.

Figure 2G:
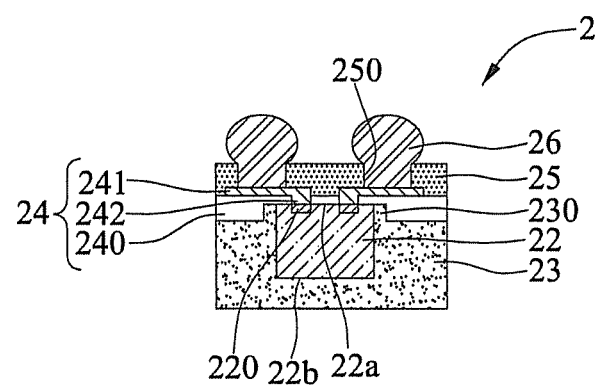

Referring to FIG. 2G, a singulation process is performed along cutting lines L of FIG. 2F so as to obtain a plurality of semiconductor packages 2.

The present invention further provides a semiconductor package 2, which has: an encapsulant 23 having a protruding portion 230; a chip 22 embedded in the protruding portion 230; and a circuit structure 24 formed on the encapsulant 23.

The chip 22 has an active surface 22a with a plurality of electrode pads 220 and an inactive surface 22b opposite to the active surface 22a, and the active surface 22a and the electrode pads 220 are exposed from the protruding portion 230 of the encapsulant 23.

The circuit structure 24 is formed on the active surface 22a of the chip 22 and electrically connected to the electrode pads 220 of the chip 22. The circuit structure 24 has at least a dielectric layer 240, a circuit layer 241 formed on the dielectric layer 240 and a plurality of conductive vias 242 formed in the dielectric layer 240 for electrically connecting the circuit layer 241 and the electrode pads 220 of the chip 22.

Furthermore, an insulating protection layer 25 is formed on the outermost dielectric layer 240 of the circuit structure 24 and has a plurality of openings 250 formed therein such that portions of the circuit layer 241 are exposed through the openings 250 so as for conductive elements 26 to be disposed thereon.

Therefore, through the design of the concave portions on the carrier, the present invention facilitates alignment of the chips so as to avoid displacement of the chips, thereby improving the product reliability.

Also, since the releasing layer is not adhesive, it will not cause displacement of the chips. Therefore, the product reliability is further improved.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor package, comprising the steps of:

providing a carrier having a concave portion and a releasing layer formed on a surface thereof;

disposing a chip on the releasing layer in the concave portion, wherein the chip has an active surface with a plurality of electrode pads and an inactive surface opposite to the active surface, the chip being disposed on the releasing layer via the active surface thereof;

forming an encapsulant on the chip and the releasing layer;

removing the releasing layer and the carrier so as to expose the active surface of the chip; and forming a circuit structure on the encapsulant and the active surface of the chip, wherein the circuit structure is electrically connected to the electrode pads of the chip.

2. The method of claim 1, wherein the carrier is made of glass or metal.

3. The method of claim 1, wherein a plurality of concave portions are provided and array arranged on the carrier.

4. The method of claim 3, after forming the circuit structure on the encapsulant and the active surface of the chip, further comprising performing a singulation process.

5. The method of claim 1, wherein the releasing layer is made of a hydrophobic material, an inorganic material or a polymer material.

6. The method of claim 1, wherein the carrier is removed first and then the releasing layer is removed.

7. The method of claim 1, wherein the releasing layer and the carrier are removed simultaneously.

8. The method of claim 1, wherein the circuit structure has at least a dielectric layer formed on the encapsulant and the active surface of the chip, a circuit layer formed on the dielectric layer and a plurality of conductive vias formed in the dielectric layer for electrically connecting the circuit layer and the electrode pads of the chip.

9. The method of claim 8, further comprising forming an insulating protection layer on the outermost dielectric layer of the circuit structure and forming a plurality of openings in the insulating protection layer such that portions of the circuit layer are exposed through the openings so as for conductive elements to be disposed thereon.

* * * * *